US012601784B2

(12) United States Patent
Kulkarni et al.

(10) Patent No.: US 12,601,784 B2
(45) Date of Patent: Apr. 14, 2026

(54) CIRCUITRY INCLUDING SCAN AND NON-SCAN REGISTERS

(71) Applicant: Arm Limited, Cambridge (GB)

(72) Inventors: Prashant Mohan Kulkarni, Cambridge (GB); Leo Soundhar Prakash Panneer, Austin, TX (US); Teresa Louise McLaurin, Dripping Springs, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 18/620,534

(22) Filed: Mar. 28, 2024

(65) Prior Publication Data

US 2025/0306098 A1     Oct. 2, 2025

(51) Int. Cl.
*G01R 31/3177*     (2006.01)
*G01R 31/3185*     (2006.01)

(52) U.S. Cl.
CPC .  *G01R 31/3177* (2013.01); *G01R 31/318533* (2013.01); *G01R 31/318536* (2013.01); *G01R 31/318541* (2013.01); *G01R 31/318544* (2013.01); *G01R 31/318583* (2013.01)

(58) Field of Classification Search
CPC ........ G01R 31/3177; G01R 31/318583; G01R 31/318544; G01R 31/318533; G01R 31/318536; G01R 31/318541
USPC ......................................... 714/726, 727, 729
See application file for complete search history.

(56) References Cited

U.S. PATENT DOCUMENTS

| | | | | |
|---|---|---|---|---|
| 7,376,915 B1 * | 5/2008 | Duewer | ......... | G01R 31/318536 716/119 |
| 9,529,044 B1 * | 12/2016 | Taneja | ........... | G01R 31/318547 |
| 9,584,121 B2 * | 2/2017 | Ye | .................. | G01R 31/318541 |
| 2007/0234159 A1 * | 10/2007 | Bushard | ......... | G01R 31/318525 714/733 |
| 2013/0091395 A1 * | 4/2013 | Kukreja | ......... | G01R 31/318594 714/E11.155 |
| 2016/0365856 A1 * | 12/2016 | Ye | ...................... | H03K 3/35625 |

* cited by examiner

*Primary Examiner* — John J Tabone, Jr.
(74) *Attorney, Agent, or Firm* — Berkeley Law & Technology Group, LLP

(57) ABSTRACT

Briefly, example apparatuses, articles of manufacture, and/or techniques are disclosed that may be implemented, in whole or in part, to implement, facilitate and/or support integrated circuit design-for-testing, such as, a scan register coupled to one or more non-scan registers via a multiplexer having first and second signal inputs.

15 Claims, 8 Drawing Sheets

Figure 7:
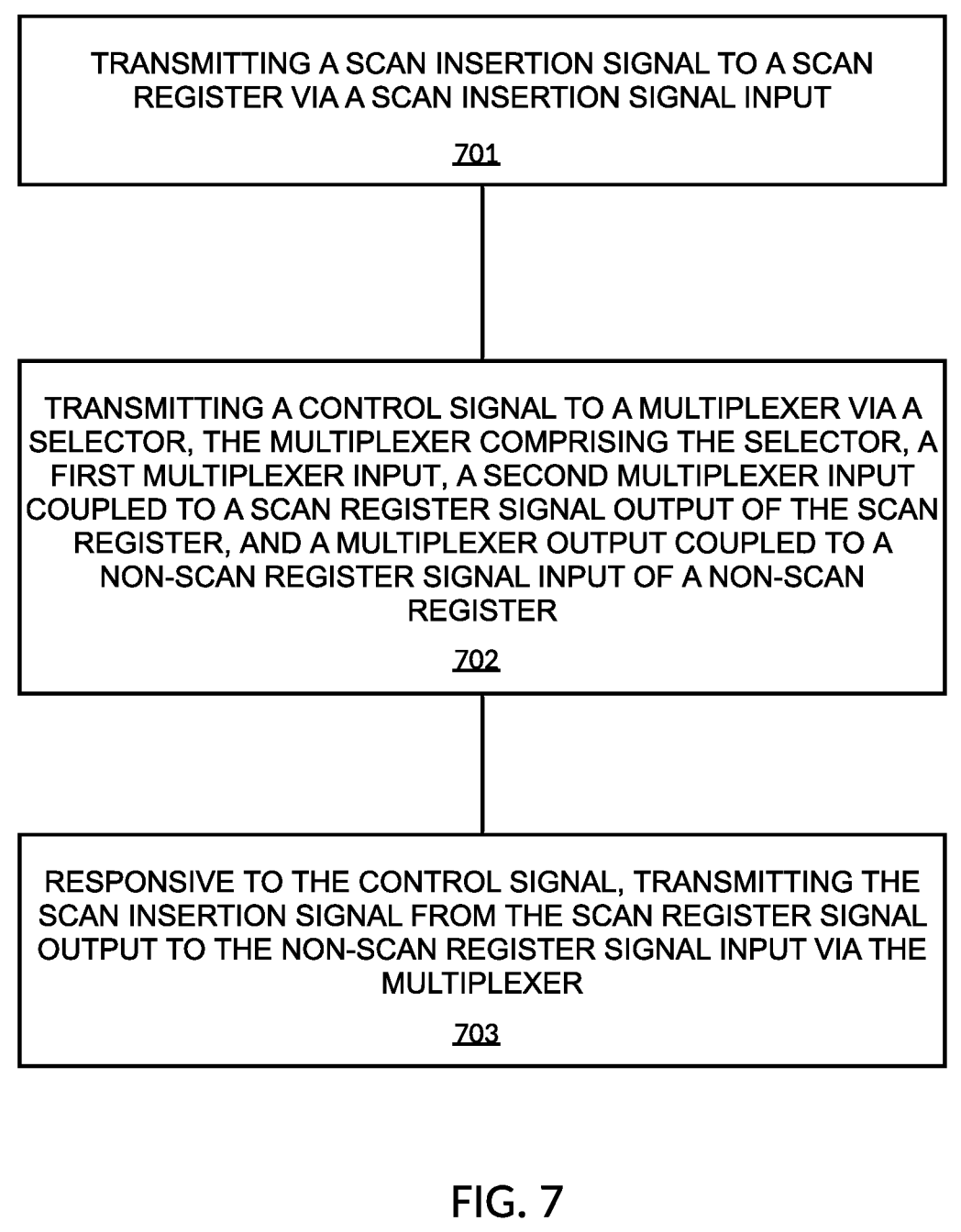

TRANSMITTING A SCAN INSERTION SIGNAL TO A SCAN
REGISTER VIA A SCAN INSERTION SIGNAL INPUT

701

TRANSMITTING A CONTROL SIGNAL TO A MULTIPLEXER VIA A
SELECTOR, THE MULTIPLEXER COMPRISING THE SELECTOR, A
FIRST MULTIPLEXER INPUT, A SECOND MULTIPLEXER INPUT
COUPLED TO A SCAN REGISTER SIGNAL OUTPUT OF THE SCAN
REGISTER, AND A MULTIPLEXER OUTPUT COUPLED TO A
NON-SCAN REGISTER SIGNAL INPUT OF A NON-SCAN
REGISTER

702

RESPONSIVE TO THE CONTROL SIGNAL, TRANSMITTING THE
SCAN INSERTION SIGNAL FROM THE SCAN REGISTER SIGNAL
OUTPUT TO THE NON-SCAN REGISTER SIGNAL INPUT VIA THE
MULTIPLEXER

NON-TRANSITORY COMPUTER-READABLE
MEDIUM

<u>801</u>

COMPUTER-READABLE CODE

CIRCUITRY INCLUDING SCAN AND NON-SCAN REGISTERS

FIELD

The present disclosure relates generally to integrated circuitry, and more particularly, to integrated circuit design for testing.

BACKGROUND

Design for testing (DFT) may include adding elements to an integrated circuit (IC) design that enable and/or assist testing a fabricated IC. For example, scan design is a DFT technique where at least a portion of an IC's registers (e.g., flip-flops and/or latches) are scan-enabled. Scan-enabled registers ("scan registers") may be used by testing tools to observe register states of a design/device under test (DUT). For example, scan registers may be connected in chains ("scan chains") that may operate as shift-registers to allow scan signals to be input to a DUT and to allow the resulting output signals to be retrieved. For instance, scan testing may be used to detect various faults, including manufacturing related faults such as stuck-at faults, timing/delay faults, transition faults, and/or the like.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 7 illustrates an example non-transitory computer-readable storage medium storing example computer-readable code for fabricating an apparatus in accordance with an implementation; and FIG. 8 illustrates an example method of operating an apparatus in accordance with an implementation.

Figure 1:
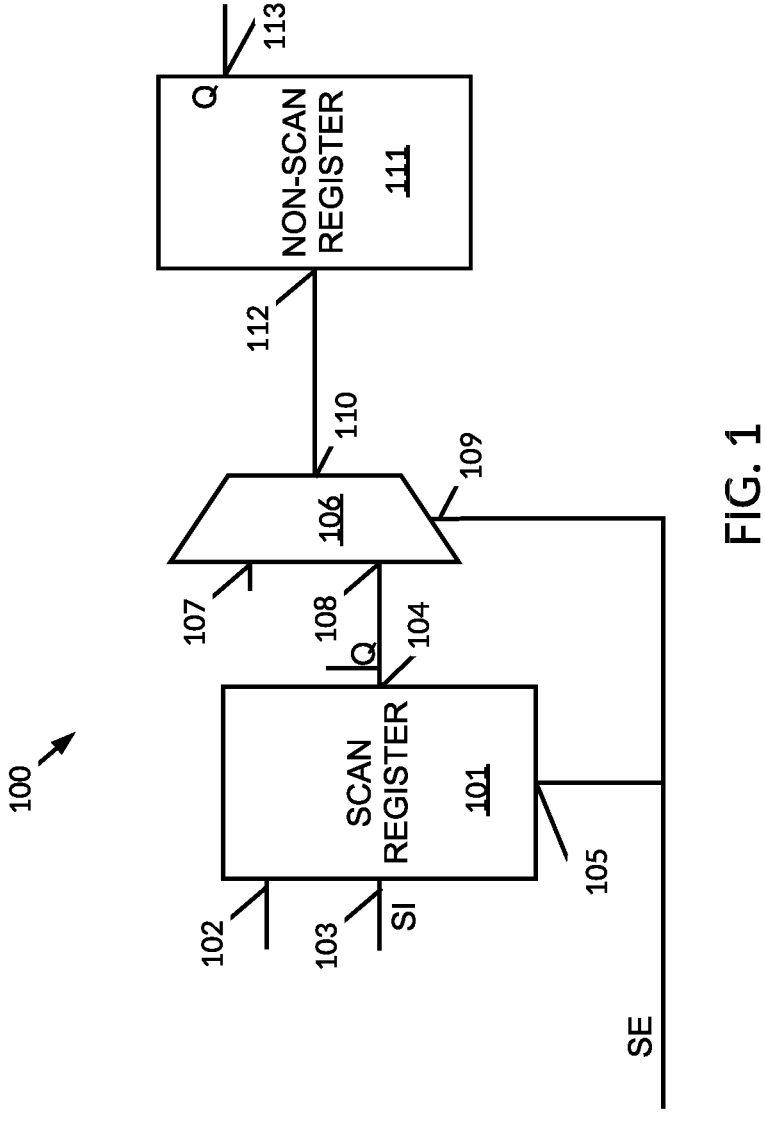
FIG. 1 illustrates an example apparatus including a scan register, a multiplexer, and a non-scan register in accordance with an implementation.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others, one or more aspects, properties, etc. may be omitted, such as for ease of discussion, or the like. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular example, implementation and/or embodiment is included in at least one example, implementation and/or embodiment of claimed subject matter. Thus, appearances of such phrases, for example, in various places throughout this specification are not necessarily intended to refer to the same implementation and/or embodiment and/or to any one particular implementation and/or embodiment. Furthermore, it is to be understood that particular features, structures, characteristics, and/or the like described are capable of being combined in various ways in one or more implementations and/or embodiments and, therefore, are within intended claim scope. Unless explicitly indicated to the contrary, reference to "another example" and/or "a further example" does not indicate that the described example is an exclusive alternative to a preceding example. In general, such examples may be alternatives to and/or additions to previous examples.

A fully scan-enabled design may provide complete observability of the register states within a device/design-under-test (DUT). However, a scan-enabled register (a "scan register", e.g., flip-flop, latch, and/or the like) may include additional circuitry over a comparable non-scan-enabled register. As examples, a mux-type D flip-flop scan-register may have a cell area around 10-20% larger than a non-scan-enabled D flip-flop, while a level-sensitive scan design (LSSD) latch scan register may have an even larger comparative area Additionally, a scan register may utilize more internal power, require more switching power, and produce more leakage power compared to a non-scan register. A partial scan-enabled design may have reduced circuit area and power requirements compared to a fully scan-enabled design. However, a partial scan-enabled design may be more difficult to test because of the unknown state of non-scan registers during the testing process. For instance, the unknown states of partial scan-enabled designs may require significantly more test time and/or may have reduced test coverage compared to fully scan-enabled designs.

Implementations of the disclosed technology may address these and/or other challenges by providing techniques to achieve improved scan testability with reduced circuit area. For instance, the disclosed techniques may provide full scan testability with partial scan area requirements. For example, as discussed below, a scan register may be connected to a non-scan register via a multiplexer (MUX). In some examples, scan insertion signals output by the scan register may be fed back to the non-scan register via the MUX in response to a scan control signal. Accordingly, the state of the scan register may be shared to the non-scan register during scan testing, providing test coverage of the non-scan register. Accordingly, compared to a full scan design, implementations of the disclosed technology may require less circuit area, less power, and produce less leakage power. Additionally, compared to a partial scan design with unknown state, implementations of the disclosed technology may provide full test coverage and/or may require less test time.

At least some examples of the present technique provide an apparatus including a scan register, a non-scan register, and a multiplexer. The scan register may include a scan insertion signal input and a scan register signal output. The non-scan register may include a non-scan register signal input. The multiplexer include a first multiplexer input, a second multiplexer input connected to the scan register signal output, a multiplexer output connected to the non-scan register signal input, and a selector. In some examples, responsive to a control signal transmitted via the selector, the multiplexer may transmit a scan insertion signal from the scan register signal output to the non-scan register signal input via the multiplexer.

At least some further examples of the present technique provide a method including transmitting a scan insertion signal to a scan register, transmitting a control signal to a multiplexer, and, responsive to the control signal, transmitting the scan insertion signal to a non-scan register. In some examples, the multiplexer may include a selector, a first multiplexer input, a second multiplexer input, a multiplexer output, and a selector. The second multiplexer input may be connected to a scan register signal output of the scan register, and the multiplexer output may be connected to a non-scan register signal input of the non-scan register. Some examples may include transmitting the scan insertion signal from the scan register signal output to the non-scan register signal input via the multiplexer, responsive to the control signal.

At least some further examples of the present technique provide computer-readable medium storing computer-readable code for the fabrication of an apparatus as set out above.

FIG. 1 illustrates an example apparatus 100 including a scan register 101, a MUX 106, and a non-scan register 111 in accordance with an implementation. The example apparatus 100 may include various circuitry comprising registers, such as, for instance, a register file, a buffer (e.g., a first-in first-out (FIFO) buffer), a memory array, and/or the like. For example, the apparatus may include a central processing unit (CPU), graphics processing unit (GPU), interconnect device, accelerator, storage device, memory device, network appliance, application-specific IC (ASIC) and/or the like.

The illustrated example apparatus 100 may include a scan register 101. The scan register 101 may comprise various bistable state-storing circuitry able to store scan insertion data responsive to scan insertion signals and normal (e.g., non-scan) functional data responsive to data input signals. For instance, the scan register 101 may comprise a dual ported circuit element, such as a flip-flop (e.g., an edge-triggered state storing circuitry) and/or a latch (e.g., a level-triggered state storing circuitry). The scan register 101 may be operable in a scan mode such that its state is controlled by scan insertion signals. For example, the scan register 101 may be an element of a scan chain comprising a number of scan registers coupled in a shift-register configuration. The scan register 101 may include a scan insertion signal input 103. For example, the scan insertion signal input 103 may be an input that may be connected to an IC test system to receive test pattern data signals. For instance, the scan insertion signal input may be connected to automatic test equipment (ATE) including an automatic test pattern generator (ATPG). As an example, the scan insertion signal input 103 may be connected to the output of a previous scan register in a scan chain and/or a scan data insertion port of the apparatus 100.

The example scan register 101 may further include a non-scan signal input 102. For example, the non-scan signal input 102 may be connected to other circuit elements to receive data signals during normal/functional operation, such as combinatorial logic circuitry, other register circuitry, and/or the like. The scan register 101 may further comprise a scan register output 104. The scan register output 104 may output a scan insertion signal received via the scan insertion signal input 103 or may output a data signal received via the non-scan signal input 102. For example, the scan register output 104 may be connected to a next scan register of a scan chain as well as additional IC elements such as combinatorial and/or sequential logic circuitry. In some implementations the scan register 101 may comprise a control signal input 105 that may receive a scan control signal, which may control whether the scan register output 104 outputs the scan insertion signal or the data signal. For example, the scan register 101 may comprise a MUX-type scan-enabled data flip-flop (SDFF) or latch, where the scan insertion signal input 103 and the non-scan signal input 102 may be connected to the inputs of an internal MUX having a selector connected to the control signal input 105. As another example, the scan register 101 may comprise a level-sensitive scan design (LSSD) latch cell. An example LSSD latch cell may include a master/leader latch and a slave/follower latch. In this example, the scan insertion signal input 103 and non-scan signal inputs 102 may be connected to the inputs of the (dual-ported) internal master/leader latch.

The illustrated example apparatus 100 may further include a MUX 106 having a first MUX input 107 and a second MUX input 108. For example, the first MUX input 107 may comprise a non-scan signal input while the second MUX input 108 may comprise a scan insertion signal input. As illustrated, the scan register output 104 may be connected to the second MUX input 108 to receive a signal output from the scan register 101. The MUX 106 may further comprise MUX output 110 and a selector 109 to control whether signals received via the first signal input 107 or the second signal input 108 may be transmitted via the MUX output 110.

The illustrated example apparatus 100 may further include a non-scan register 111. The non-scan register 111 may comprise various bistable state storing circuitry, such as a flip flop and/or latch. For instance, compared to the scan register 101, the non-scan register 111 may lack a scan insertion signal input. As illustrated, the example non-scan register 111 comprises a non-scan register signal input 112 and a non-scan register signal output 113. In this example, the non-scan register signal input 112 is connected to the output 110 of the MUX 106. In a non-scan operational mode, the MUX 106 may transmit signals received at the first MUX input 107 to the non-scan register signal input 112 via the MUX output 110. Responsive to a scan-enabling control signal input to selector 109, the MUX 106 may transmit a scan insertion signal from the scan register output 104 to the non-scan register signal input 112 via the second MUX input 108. In some implementation, the control signal transmitted to MUX 106 may be the same signal as transmitted to scan register 101. In other implementations, separate scan-enabling control signals may be transmitted to the MUX 106 and the scan register 101. Accordingly, in the scan-enabled operational mode, the non-scan register 111 may shadow the state of the scan register 101.

Figure 2:
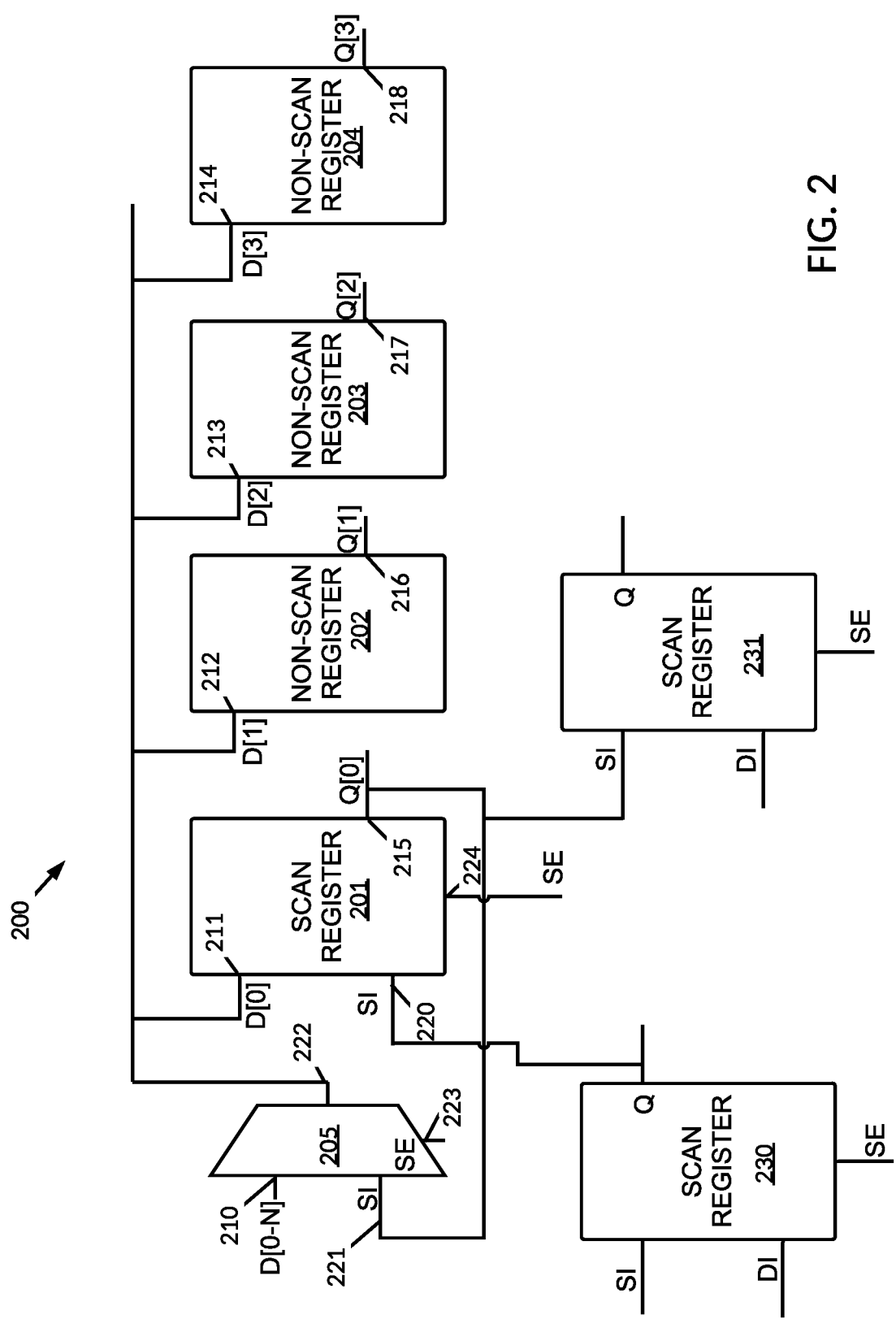
FIG. 2 illustrates another example apparatus including a scan register and a plurality of non-scan registers in accordance with an implementation.

FIG. 2 illustrates an example apparatus 200 including a scan register 201 and a plurality of non-scan registers 202-204. For example, FIG. 2 may illustrate an implementation of an apparatus 100 of FIG. 1 in which a scan register 101 and a non-scan register 111 may be common elements of a larger functional circuit block, such as a register file, memory array, buffer, and/or the like. Although as illustrated, the apparatus 200 comprises a block of four registers 201-204, in various implementations any number of non-scan registers may shadow the scan register 201. For instance, array circuitry storing hundreds or thousands of bits may be comprised of hundreds or thousands of non-scan registers shadowing a scan register 201. Additionally, although illustrated at the first address ([0]), the scan register 201 may be located anywhere within the array.

In the illustrated example, the scan register 201 comprises a scan insertion signal input 220. For example, the scan insertion signal input 220 may be connected to the output of an earlier scan register 230 in a scan chain (e.g., scan registers 230, 201, 231). As another example, the scan insertion signal input 220 may be connected to a scan insertion data input of the apparatus 200 (not pictured). As discussed above, the state of the scan register 201 may be controlled via a control signal input 224 to reflect the scan insertion signal input 220 or the non-scan signal input 211.

In this example, the scan register 201 and each respective non-scan register 202, 203, 204 comprises a respective non-scan signal input 211, 212, 213, 214. The non-scan signal inputs 211-214 may be connected to the output 222 of a multiplexer 205. Here, the multiplexer 205 comprises a first, non-scan signal input 210, such as a data signal input, and a second, scan signal input 221 connected to the output 215 of the scan register 201. In this example, during a normal operational mode, input signals arriving at MUX input 210 may be transmitted via the MUX output 222 to the non-scan signal inputs 211-214. Here, responsive to a control signal received at selector 223, the example multiplexer 205 may transmit a scan insertion signal from the scan register signal output 215 to each of the respective non-scan register signal inputs 212-214 of the plurality of non-scan registers 202-204 via the second multiplexer input 221. Additionally, in this example configuration, the scan insertion signal may be fed back to the scan register 201 via the non-scan signal input 211 of the scan register 201. For instance, if a scan insertion signal sets the scan register 201 to state x at a first time t, then the registers 201-204 may be set to state x at a subsequent time t+1.

Figure 3:
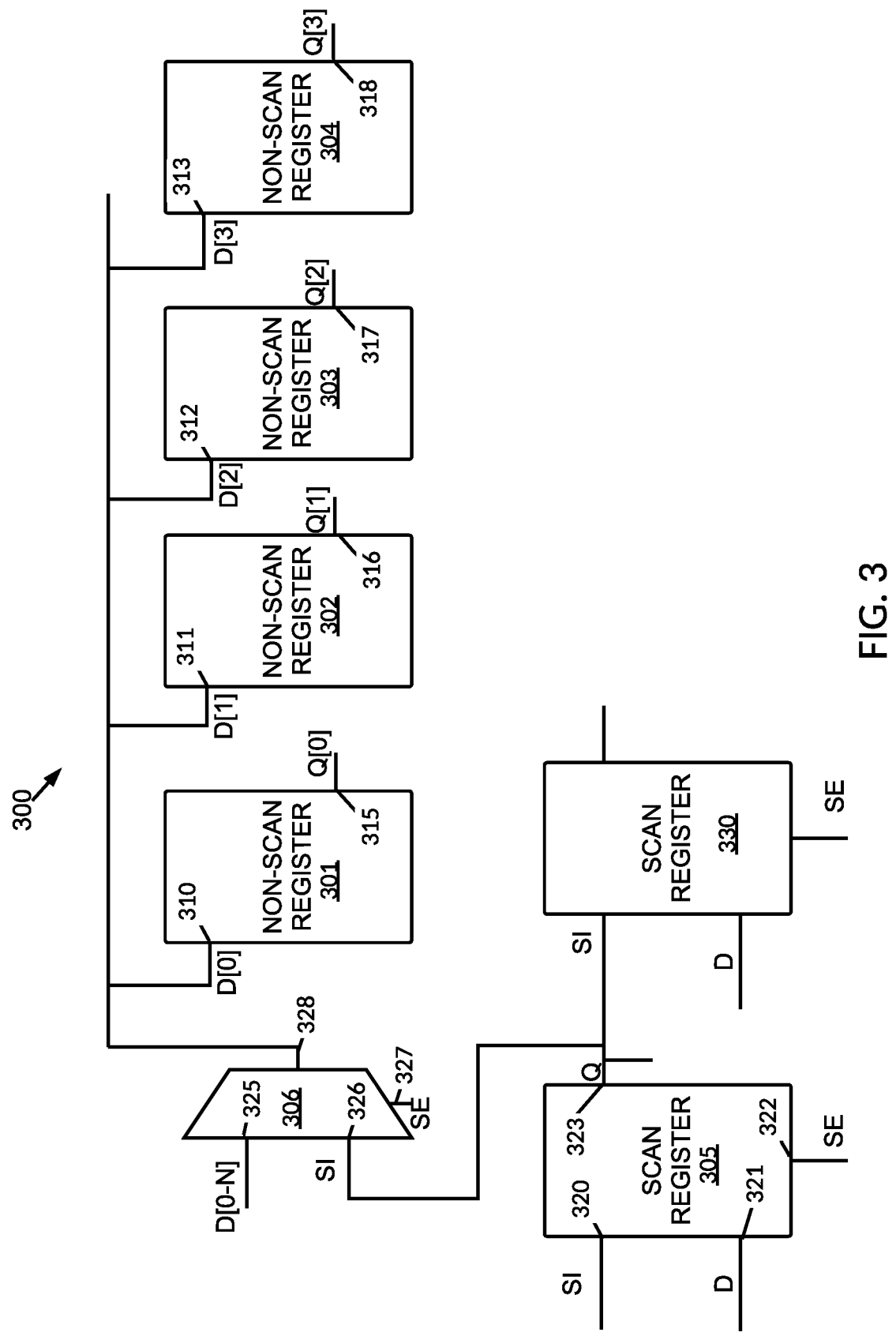
FIG. 3 illustrates another example apparatus including a scan register and a plurality of non-scan registers in accordance with an implementation.

FIG. 3 illustrates another example apparatus 300 including a scan register and a plurality of non-scan registers 301-304. For example, FIG. 3 may illustrate an implementation of an apparatus 100 of FIG. 1 in which a scan register 101 and non-scan register 111 may be elements of separate functional circuit blocks. For instance, the plurality of non-scan registers 301-304 may comprise a register file, memory array, buffer, and/or the like, while the scan register 305 may be a register of a combinatorial logic circuit, sequential logic circuit, other register file, memory array, buffer, and/or the like. Likewise, the apparatus 300 may comprise any number of non-scan registers that shadow the scan register 305. For instance, array circuitry storing hundreds or thousands of bits may be comprised of hundreds or thousands of non-scan registers shadowing the scan register 305.

In the illustrated example, the scan register 305 comprises a scan insertion signal input 320. For example, the scan insertion signal input 320 may be connected to the output of an earlier scan register in a scan chain (e.g., a scan chain including scan registers 305 and 330). As another example, the scan insertion signal input 320 may be connected to a scan insertion data input of the apparatus 300 (not pictured). As discussed above, the state of the scan register 305 may be controlled via a control signal input 322 to reflect the scan insertion signal input 320 or the non-scan signal input 321.

In this example, each respective non-scan register 301, 302, 303, 304 comprises a respective non-scan signal input 310, 311, 312, 313. The non-scan signal inputs 310-313 may be connected to the output 328 of a multiplexer 306. Here, the multiplexer 306 comprises a first, non-scan signal input 325, such as a data signal input, and a second, scan signal input 326 connected to the output 323 of the scan register 305. In this example, during a normal operational mode, input signals arriving at MUX input 325 may be transmitted via the MUX output 328 to the non-scan signal inputs 310-313. Here, responsive to a control signal received at selector 327, the example multiplexer 306 may transmit a scan insertion signal from the scan register 305 signal output 323 to each of the respective non-scan register signal inputs 310-313 of the plurality of non-scan registers 301-304 via the second multiplexer input 326. For instance, if a scan insertion signal sets the scan register 305 to state x at a first time t, then the registers 301-304 may be set to state x at a subsequent time t+1.

Figure 4:
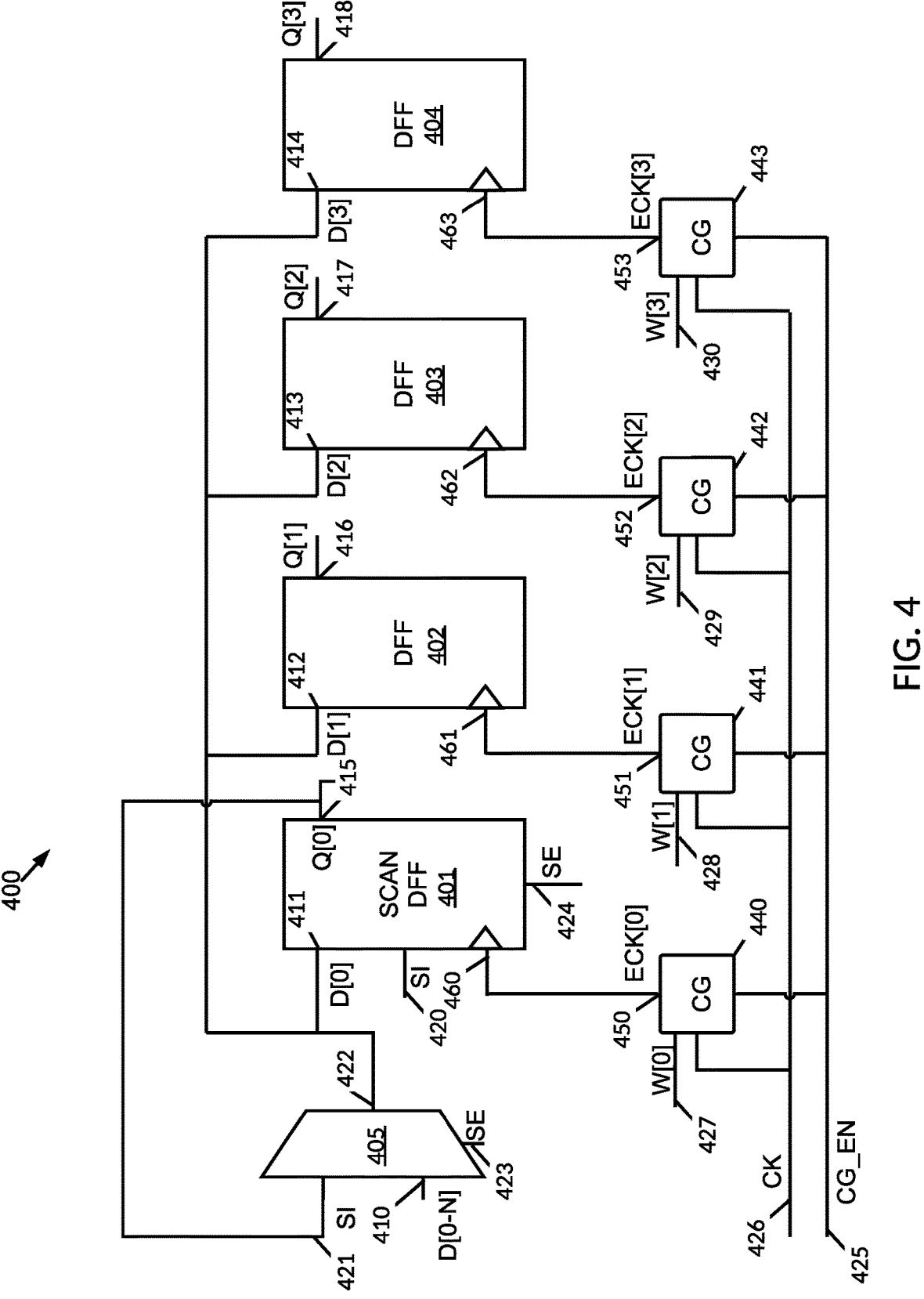
FIG. 4 illustrates another example apparatus including a scan register and a plurality of non-scan registers in accordance with an implementation.

FIG. 4 illustrates an example apparatus 400 including a scan register 401 and a plurality of non-scan registers 402-404. In this example, the scan register 401 comprises a scan D-type flip-flop (SDFF) 401 and the non-scan registers 402-404 comprise non-scan D-type flip-flops (DFFs) 402-404. In some implementations, apparatus 400 may be an implementation of an apparatus 100 as described with respect to FIG. 1, such as an implementation of an apparatus 200 as described with respect to FIG. 2. For instance, FIG. 4 may illustrate an implementation in which the SDFF 401 and the non-scan DFFs 402-404 may be common elements of a larger functional circuit block, such as a register file, memory array, buffer, and/or the like. Although as illustrated, the apparatus 400 comprises a block of four flip-flops 401-404, in various implementations any number of non-scan flip-flops may shadow the SDFF 401. For instance, array circuitry storing hundreds or thousands of bits may be comprised of hundreds or thousands of non-scan DFFs shadowing the SDFF 401. Additionally, although illustrated at the first address ([0]), the SDFF 401 may be located anywhere within the array. Additionally, in further implementations, different registers 401-404 may be different types. For instance, the registers 401-404 may be a mix of different types of flip-flops, different types of latches, flip-flops and latches, and/or combinations thereof.

In the illustrated example, the SDFF 401 comprises a scan insertion signal input 420. For example, the scan insertion signal input 420 may be connected to the output of an earlier SDFF in a scan chain or a scan insertion data input of the apparatus 400 (not pictured). As discussed above, the state of the SDFF 401 may be controlled via a control signal input 424 to reflect the scan insertion signal input 420 or the non-scan signal input 411.

In this example, the SDFF 401 and each respective non-scan DFF 402, 403, 404 comprises a respective non-scan signal input 411, 412, 413, 414. Additionally, in this example the flip-flops 401-404 may receive clock signals (ECK[0-3]) via clock inputs 460, 461, 462, and 463, respectively. The SDFF 401 and DFFs 402-404 may be edge-triggered circuits such that their states are updated on a rising and/or falling edge of the received clock signals. In the illustrated example, clock inputs 460-463 are connected to outputs 450, 451, 452, 453 of corresponding clock gates 440, 441, 442, 443, respectively. In this example, the clock gates 440-443 are connected to a clock signal path 426 to receive clock signals (CK) (e.g., clock pulses). Additionally, the clock gates 440-443 are connected to a clock enabling signal path 425 to receive a clock gate enabling signal (CG_EN). In this example, responsive to CG_EN, the clock gates 440-443 may output effective clock signals (ECK[0-3]) corresponding to the clock signal received via path 426. For example, CG_EN may be asserted during a scan shift operation to update the state of the SDFF 401 according to the scan insertion signal and to propagate the scan insertion signal to the non-scan signal inputs 411-414. Further, the clock gates 440-443 comprise control inputs 427, 428, 429, 430, respectively. The control inputs 427-430 may receive respective control signals (e.g., W[0-4]) to control whether the corresponding clock signal is transmitted via the corresponding output. For example, the clock gates 440-443 may comprise combinatorial logic to perform an OR operation on CG_EN and W[0-3] to transmit the corresponding ECK[0-3]. In some implementations, the control signals W[0-3] may be used during scan testing to enable and/or disable their corresponding registers 401-404 scan capture/normal operations. As an example, a control signal W[2] input via control input 429 may control whether an ECK signal is transmitted to DFF 403.

Similar to FIG. 2, the non-scan signal inputs 411-414 may be connected to the output 422 of a multiplexer 405. Here, the multiplexer 405 comprises a first, non-scan signal input 410, such as a data signal input, and a second, scan signal input 421 connected to the output 415 of the SDFF 401. In this example, during a normal operational mode, input signals arriving at MUX input 410 may be transmitted via the MUX output 422 to the non-scan signal inputs 411-414. Here, responsive to a control signal received at selector 423, the example multiplexer 405 may transmit a scan insertion signal from the SDFF signal output 415 to each of the respective non-scan DFF signal inputs 412-414 of the plurality of non-scan DFFs 402-404 via the second multiplexer input 421. Additionally, in this example configuration, the scan insertion signal may be fed back to the SDFF 401 via the non-scan signal input 411 of the SDFF 401. For instance, if a scan insertion signal sets the SDFF 401 to state x at a first clock signal r, then the registers 401-404 may be set to state x at a next clock signal r+1. Accordingly, in case of a defect, scan test measurements of the output states of clock signals r and r+1 may be used to distinguish between a defect in the SDFF 401 and a defect in the DFFs 402-404.

In further examples, other clock signaling techniques may be employed according to the DUT. For example, some implementations may employ level-sensitive scan design (LSSD), such as some designs using registers comprising latches. As another example, some implementations may employ clocked-scan D flip-flops. Compared to muxed-D scan designs, these architectures may include multiple clock signals, such as, for example, multiple system clock and/or dedicated scan clock signals.

Figure 5:
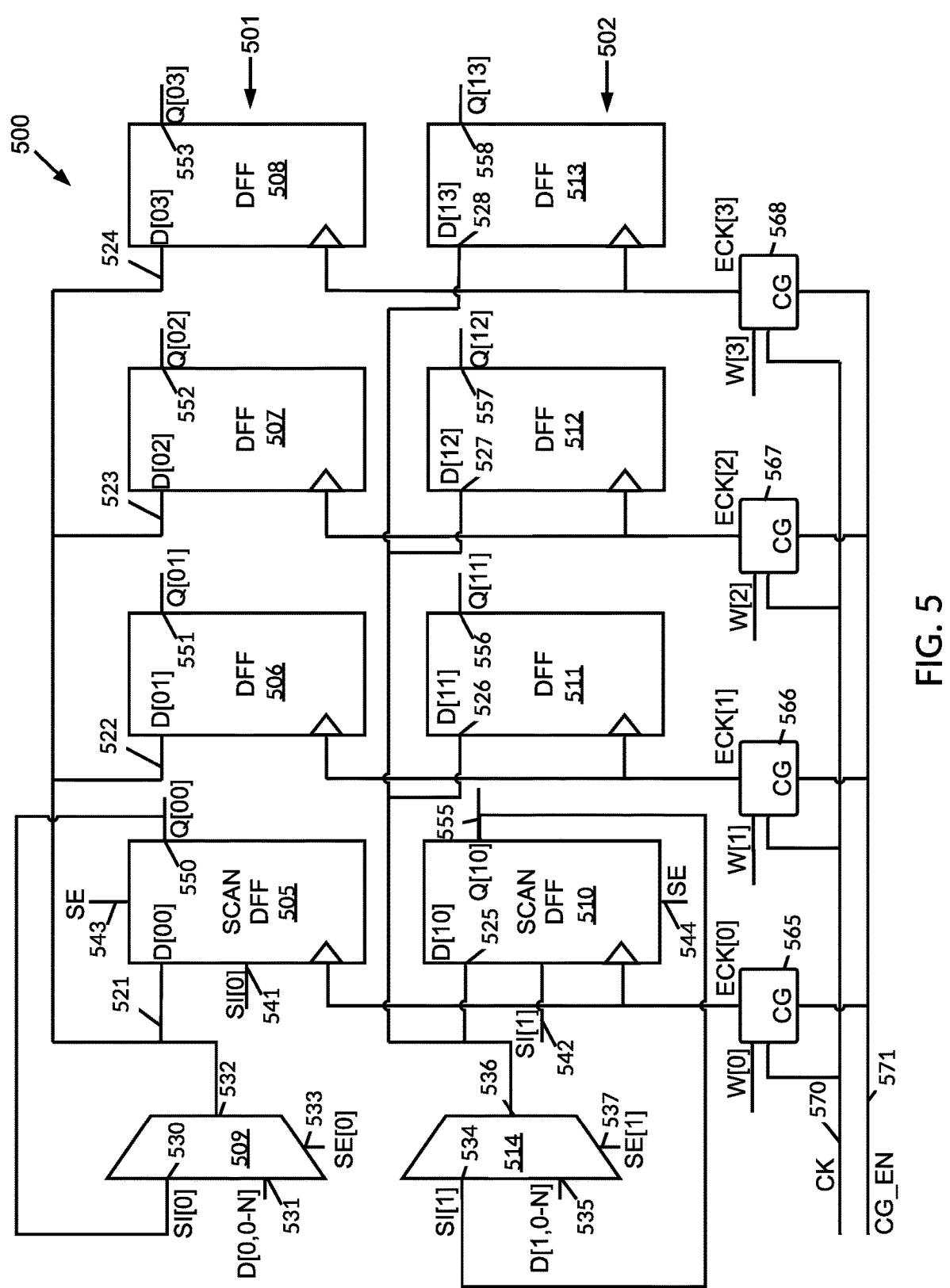
FIG. 5 illustrates an example apparatus including a register array comprising a plurality of lanes in accordance with an implementation.

FIG. 5 illustrates an example apparatus 500 including a register array comprising a plurality of lanes 501, 502. For instance, the example apparatus 500 may be an implementation of apparatuses described herein, such as apparatus 100 of FIG. 1, apparatus 200 of FIG. 2, and/or apparatus 400 of FIG. 4. For example, the register array may comprise a memory array or other 2D storage circuit, register file, buffer, and/or the like. In various implementations, the array may comprise a number of lanes 501, 502, where each lane comprises a number of register entries 505-508, 510-513. While as illustrated, the apparatus comprises a 2×4 array (2 lanes, 4 entries), implementations may comprise any size array. For instance, the array may comprise hundreds or thousands of lanes and hundreds or thousands of entries. Additionally, while illustrated as D-type flip flops, the registers of apparatus 500 may comprise any register type as discussed herein.

In the illustrated example, each respective lane 501, 502 comprises respective scan registers 505; 510 and respective non-scan registers 506, 507, 508; 511, 512, 513. Here, each scan register 505, 510 comprises a respective scan insertion signal input 541, 542. Accordingly, in some implementations, each lane 501, 502 may receive different scan insertion signals. As an example, the scan registers 505, 510 of the array may be connected in a scan chain. In further implementations, some lanes 501, 502 may lack scan registers 505, 510. For instance, in an implementation, the scan register 510 may comprise a non-scan register and the scan register 505 may be coupled to MUX 514 to provide scan insertion signals to lane 502 as well as lane 501. Additionally, in further implementations, the scan registers of different lanes may occupy different entry locations. For instance, in an implementation, scan register 510 may occupy entry instead of entry (e.g., scan register 510 and non-scan register 511 may be in exchanged locations).

In this example, each respective lane 501, 502 further comprises respective multiplexers 509, 514 having first inputs 531, 535 and second inputs 534, 530. The respective first inputs 531, 535 may be coupled to signal paths to receive signals, such as data signals, which are output to respective non-scan inputs 521, 522, 523, 524; 525, 526, 527, 528 of the registers 505-508; 510-513. The respective second inputs 530, 534 may be connected to respective signal outputs 550, 555 of the scan registers 505, 510.

In this example, responsive to control signals input to respective selectors 533, 537, each respective MUX 509, 514 may transmit respective scan insertion signals from respective scan register outputs 550, 555 to the non-scan signal inputs 521-524; 525-528 of the respective registers 505-508; 510-513. In various implementations, the scan control signal inputs 543, 544 of the scan registers 505, 510 and the selector inputs 533, 537 may be connected to a common scan control signal path, separate scan control signal paths, and/or combinations thereof. For instance, in an example implementation, the selectors 533, 537 may be connected to separately addressable scan enable signal paths (e.g., SE[0] and SE[1] may be separate scan enabling control signals). As another example, the selectors 533, 537 may be connected to a common scan enable signal path (e.g., SE[0] and SE[1] may be instances of the same scan enabling control signal.

In various implementations, the non-scan registers 506-508; 511-513 of each lane 501, 502 may shadow the state of the respective scan registers 505, 510 of the respective lanes. In the illustrated example, the registers 505-508, 510-513 comprise D-type flip-flops coupled to clock gates 565, 566, 567, 568. For example, the clock signaling may be as described with respect to FIG. 4, where each clock gate 565-568 provides a corresponding clock signal to a column of register entries. For instance, SDFF 505 and SDFF 510 are connected to clock gate 565, etc. In further implementations, any suitable clock signaling configuration may be provided. In the illustrated example, responsive to control signals input to selectors 533, 537 and scan control inputs 543, 544, scan insertion signals input to the scan insertion signal inputs 541, 542 of the respective SDFFs 505, 510 at a first clock signal are input to the non-scan signal inputs 521-524; 525-528 at a next clock signal. Accordingly, outputs 550, 551, 552, 553; 555, 556, 557, 558 shadow the scan insertion data signals provided via scan insertion signal inputs 541, 542.

Figure 6:
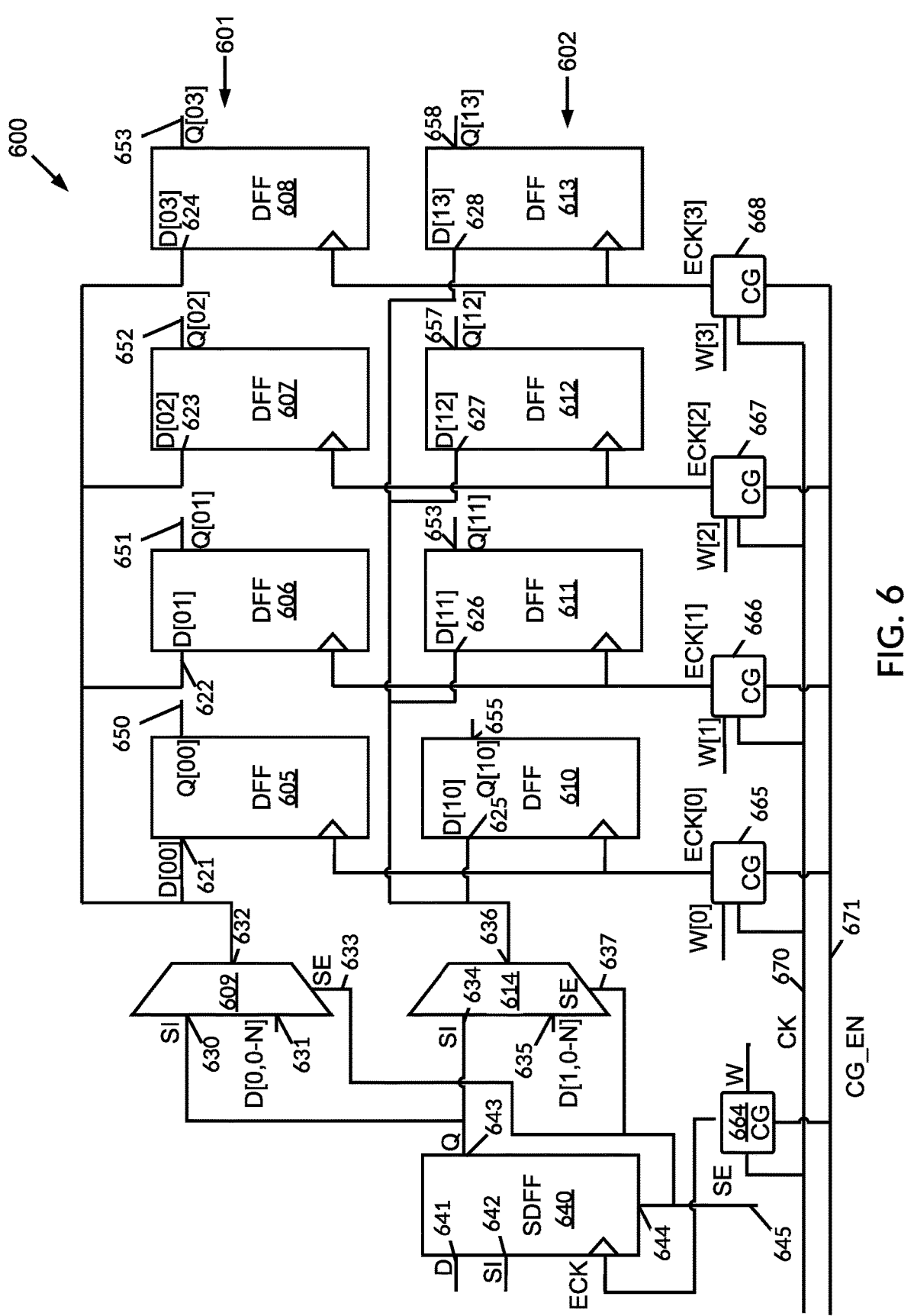
FIG. 6 illustrates another example apparatus including a register array comprising a plurality of lanes in accordance with an implementation.

FIG. 6 illustrates an example apparatus 600 including a register array comprising a plurality of lanes 601, 602. Compared to the apparatus 500 of FIG. 5, apparatus 600 includes a scan register 640 external to the register array. For instance, the example apparatus 600 may be an implementation of various apparatuses described herein, such as apparatus 100 of FIG. 1, and/or apparatus 300 of FIG. 3. For example, the register array may comprise a memory array or other 2D storage circuit, register file, buffer, and/or the like. In various implementations, the array may comprise a number of lanes 601, 602, where each lane comprises a number of register entries 605-608, 610-613. While as illustrated, the apparatus comprises a 2×4 array (2 lanes, 4 entries), implementations may comprise any size array. For instance, the array may comprise hundreds or thousands of lanes and hundreds or thousands of entries. Additionally, while illustrated as D-type flip flops, the registers of apparatus 600 may comprise any register type as discussed herein.

In the illustrated example, each respective lane 601, 602 comprises respective non-scan registers 605, 606, 607, 608; 610, 611, 612, 613. Each respective lane 601, 602 further comprises respective multiplexers 609, 614 having first inputs 631, 635 and second inputs 630, 634. The respective first inputs 631, 635 may be coupled to signal paths to receive signals, such as data signals, which are output to respective non-scan inputs 621, 622, 623, 624; 625, 626, 627, 628 of non-scan registers 605-608; 610-613. The respective second inputs 630, 634 may be connected to a signal outputs 643 of a scan register 640. The scan register may comprise a scan insertion signal input 642, a non-scan signal input 641 and a signal output 643. For instance, scan register 640 may be implemented as described with respect to scan register 305 of FIG. 3. Accordingly, in this example, the multiplexers 609, 614 may receive a common scan insertion signal from the output 643 of the scan register 640. In further implementations, respective multiplexers 609, 614 of different lanes 601, 602 may be connected to different external scan registers. For instance, the multiplexers of a first set of one or more lanes might be connected to a first scan register, the multiplexers of a second set might be connected to a second scan register, and so on.

In this example, each respective MUX comprises a selector 633, 637, which controls whether signals received at the first inputs 631, 635 or signals received at the second inputs 630, 634 are output by their respective outputs 632, 636. In the illustrated example, the selectors 633, 637 as well as the scan control input 644 of scan register 640 are connected to receive a common control signal 645 (e.g., scan enable signal SE). In further implementations, the different inputs may be separately addressable to receive separate control signals (e.g., as discussed with respect to FIG. 5).

In the illustrated example, responsive to control signals input to the respective selectors 633, 637, each respective MUX 609, 614 may transmit the respective scan insertion signal from the scan register output 643 to the non-scan signal inputs 621-624; 625-628 of the respective non-scan registers 605-608; 610-613. Accordingly, in various implementations, the non-scan registers 605-608; 610-613 of each lane 601, 602 may shadow the state of the scan register 640. In the illustrated example, the registers 605-608, 610-613, 640 comprise D-type flip-flops coupled to clock gates 665, 666, 667, 668, 664, respectively. For example, the clock signaling may be as described with respect to FIG. 4, where clock gate 664 provides a clock signal (ECK) to scan register 640 and each clock gate 665-668 provides a corresponding clock signal to a column of register entries. For instance, SDFF 605 and SDFF 610 are connected to clock gate 665, etc. In further implementations, any suitable clock signaling configuration may be provided. Accordingly, in the illustrated example, responsive to control signals input to selectors 633, 637 and scan control signal input 644, scan insertion signals input via the scan insertion signal input 642 of the SDFF 640 at a first clock signal are input to the non-scan signal inputs 621-624; 625-628 at a next clock signal. Accordingly, outputs 650, 651, 652, 653; 655, 656, 657, 658 shadow the scan insertion data signals provided via scan insertion signal inputs 642 and output via the SDFF signal output 643.

FIG. 7 illustrates an example method of operation of a data processing apparatus in accordance with an implementation. In some implementations, the illustrated method may be performed by a data processing apparatus as described with any apparatuses described herein, such as described with respect to FIGS. 1-6. For example, the illustrated method may be performed as aspects of operation of DFT circuitry, such as during scan testing, built-in self-testing, and/or the like.

The example method may include operation 701, which may include transmitting a scan insertion signal to a scan register via a scan insertion signal input. For example, operation 701 may include transmitting a scan insertion signal to scan registers such as scan registers 101; 201; 305; 401; 505,510; and/or 640 as described above. For example, operation 701 may include transmitting the scan insertion signal to scan insertion signal inputs of the scan registers, such as, for example, via a scan chain. As another example, operation 701 may include transmitting a respective scan insertion signal to a respective scan register via a respective scan insertion signal input. For instance, operation 701 may be performed as described with respect to SDFFs 500, 510 of FIG. 5.

The example method may further include operation 702, which may include transmitting a control signal to a multiplexer via a selector. In some implementations, the multiplexer may include a selector, a first multiplexer input, a second multiplexer input coupled to a scan register output of a scan register, and a multiplexer output coupled to a non-scan register signal input of a non-scan register. For example, the multiplexer may be as described with respect to multiplexer 106 of FIG. 1, multiplexer 205 of FIG. 2, multiplexer 306 of FIG. 3, and/or multiplexer 405 of FIG. 4. In some implementations, operation 702 may comprise transmitting the control signal to multiple such multiplexers, such as the respective multiplexers of a register array. For instance, operation 702 may include transmitting a respective control signal to a respective multiplexer via a respective selector such as described with respect to multiplexers 509, 514 of FIG. 5, and/or multiplexers 609, 614 of FIG. 6. Additionally, as described with respect to these figures, operation 702 may comprise different control signals to different multiplexers.

The example method may further include operation 703, which may include transmitting the scan insertion signal from the scan register signal output to the non-scan register signal input of the non-scan register. In some implementations, the scan insertion signal may be transmitted to the non-scan register signal inputs responsive to the control signal transmitted to the selector of the multiplexer. Additionally, in implementations including a scan register within a common circuit block (e.g., as described with respect to FIGS. 2, 4, and 5), operation 703 may include transmitting the scan insertion signal from the scan register signal output to the non-scan register signal input of the scan register, as described above.

In further implementations operation 703 may include transmitting the scan insertion signal from the scan register signal output to a plurality of non-scan register signal inputs of a corresponding plurality of non-scan registers via the multiplexer. For example, operation 703 may include transmitting a scan insertion signal to a plurality of non-scan registers as described with respect to FIGS. 2-4, FIG. 6, and/or each lane 501, 502 of FIG. 5. In some further implementations, operation 703 may comprise transmitting multiple respective scan insertion signals to respective pluralities of non-scan registers, such as described with respect to scan registers 505, 510 and non-scan registers 506-508, 511-513 of FIG. 5.

As discussed above, the non-scan registers may shadow the scan register(s), such that the state of the scan register at a first time is propagated to the corresponding non-scan register(s). For example, in some implementations, the registers may be flip-flops synchronized to a clock signal, such as D-type flip-flops. In these implementations, the scan insertion signal(s) may be input to the scan register(s) responsive to a first clock signal and the scan insertion signal may be input to the non-scan register(s) responsive to a second clock signal following the first clock signal. For instance, the scan insertion signal and/or signals may be propagated as discussed with respect to FIGS. 4-6.

Figure 8:
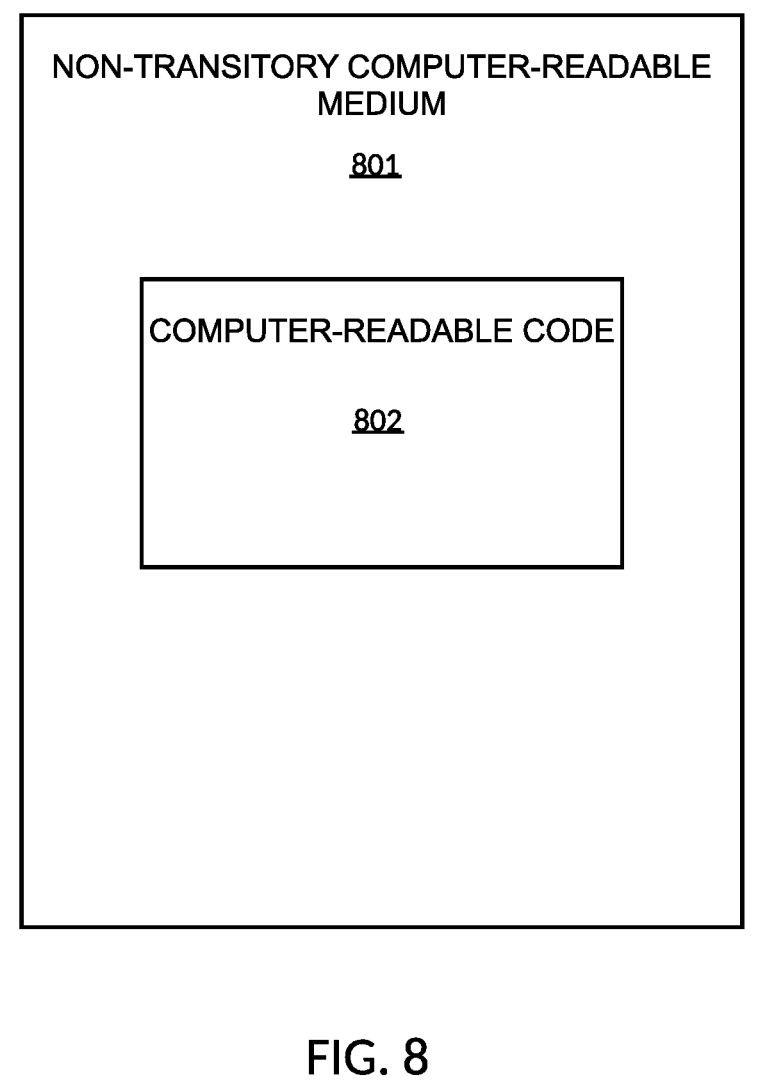

Concepts described herein may be embodied in computer-readable code for fabrication of an apparatus that embodies the described concepts. FIG. 8 illustrates an example non-transitory computer-readable storage medium 801 storing such computer-readable code 802. For example, the computer-readable code 802 can be used at one or more stages of a semiconductor design and fabrication process, including an electronic design automation (EDA) stage, to fabricate an integrated circuit comprising the apparatus embodying the concepts. The above computer-readable code 802 may additionally or alternatively enable the definition, modelling, simulation, verification and/or testing of an apparatus embodying the concepts described herein.

For example, the computer-readable code 802 for fabrication of an apparatus embodying the concepts described herein can be embodied in code 802 defining a hardware description language (HDL) representation of the concepts. For example, the code 802 may define a register-transfer-level (RTL) abstraction of one or more logic circuits for defining an apparatus embodying the concepts. The code 802 may define a HDL representation of the one or more logic circuits embodying the apparatus in Verilog, System-Verilog, Chisel, or VHDL (Very High-Speed Integrated Circuit Hardware Description Language) as well as intermediate representations such as FIRRTL. Computer-readable code 802 may provide definitions embodying the concept using system-level modelling languages such as SystemC and System Verilog or other behavioural representations of the concepts that can be interpreted by a computer to enable simulation, functional and/or formal verification, and testing of the concepts.

Additionally or alternatively, the computer-readable code 802 may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code 802 a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code 802 may comprise a mix of code 802 representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code 802 defining instructions which are to be executed by the defined apparatus once fabricated.

In various implementations, the computer-readable code 802 may include code 802 to be used during scan testing and/or for the design-for-testing features of the fabricated apparatus. In some implementations, the code 802 may include indicators associated with various components to indicate their behavior and/or status during testing. For example, the code 802 may include code associate with different registers to prevent or cause them to be scanned during a testing procedure. For instance, the code 802 may include indicators associated with the non-scan registers to prevent them from being scanned during a testing procedure. As another example, the code 802 may include indicators associated with various components to indicate expected behavior of components during scan testing. For instance, the code 802 may include indicators associated with non-scan registers indicating that they are expected to shadow particular scan registers during scan testing. Such indicators may be defined according to various configurations of different implementations. For instance, with respect to FIG. 1, code for fabricating non-scan register 111 may include an indicator that non-scan register 111 is a shadow register of scan register 101. As another example, with respect to FIG. 5, code 802 for fabricating non-scan registers 506-508 may include indicators that they are shadow registers of scan register 505 and code 802 for fabricating non-scan registers 511-513 may include indicators that they are shadow registers of scan register 510.

In some implementations, the code 802 may include code 802 to influence a circuit layout process. For instance, in some cases, the code 802 may be used during a circuit optimization procedure involving an automated detection and removal of unnecessary or redundant circuitry and/or replacement of certain circuitry with other circuitry. The code 802 may include code 802 associated with the multiplexers described herein to associate them with particular registers and/or prevent their removal during a circuit optimization process (e.g., a "do not touch" indicator). For instance, with respect to FIG. 6, code 802 may include code associating multiplexers 609, 614 with the register array 605-608; 610-613 and/or code preventing the multiplexers 609, 614 from being removed from the array and/or circuit design during a circuit optimization procedure.

Such computer-readable code 802 can be disposed in any known transitory computer-readable medium (such as wired or wireless transmission of code 802 over a network) or non-transitory computer-readable medium 801 such as semiconductor, magnetic disk, or optical disc. An integrated circuit fabricated using the computer-readable code 802 may comprise components such as one or more of a central processing unit, graphics processing unit, neural processing unit, digital signal processor or other components that individually or collectively embody the concept.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

Some configurations of the present techniques are described by the following numbered clauses:

Clause 1. An apparatus, comprising:

a scan register comprising a scan insertion signal input and a scan register signal output;

a non-scan register comprising a non-scan register signal input; and a multiplexer comprising a first multiplexer input, a second multiplexer input coupled to the scan register signal output, a multiplexer output coupled to the non-scan register signal input, and a selector;

wherein, responsive to a control signal transmitted via the selector, the multiplexer is to transmit a scan insertion signal from the scan register signal output to the non-scan register signal input via the second multiplexer input.

Clause 2. The apparatus of clause 1, further comprising:

a plurality of non-scan registers, each comprising a respective non-scan register signal input, wherein responsive to the control signal, the multiplexer is to transmit the scan insertion signal from the scan register signal output to each of the respective non-scan register signal inputs of the plurality of non-scan registers via the second multiplexer input.

Clause 3. The apparatus of any preceding clause, further comprising:

a register array comprising a plurality of lanes, wherein each respective lane comprises:

a respective scan register comprising a respective scan insertion signal input and a respective scan register signal output;

a respective non-scan register comprising a respective non-scan register signal input; and a respective multiplexer comprising a respective first multiplexer input, a respective second multiplexer input coupled to the respective scan register signal output, a respective multiplexer output coupled to the respective non-scan register signal input, and a respective selector;

wherein, responsive to a respective control signal transmitted via the respective selector, the respective multiplexer is to transmit a respective scan insertion signal from the respective scan register signal output to the respective non-scan register signal input via the respective second multiplexer input.

Clause 4. The apparatus of any preceding clause, wherein, for each respective lane:

the respective scan register further comprises a respective non-scan signal input coupled to the respective multiplexer output; and responsive to the respective control signal transmitted via the respective selector, the respective multiplexer is to transmit the respective scan insertion signal from the respective scan register signal output to the respective non-scan signal input of the respective scan register via the respective second multiplexer input.

Clause 5. The apparatus of any preceding clause wherein the scan register further comprises a non-scan signal input coupled to the multiplexer output; and responsive to the control signal transmitted via the selector, the multiplexer is to transmit the scan insertion signal from the scan register signal output to the non-scan signal input of the scan register via the second multiplexer input.

Clause 6. The apparatus of any preceding clause, wherein the scan register and the plurality of non-scan registers comprise a register file, a buffer or a memory array, or a combination thereof.

Clause 7. The apparatus of any preceding clause, wherein the plurality of non-scan registers comprise a register file, a buffer or a memory array, or a combination thereof coupled to the scan register.

Clause 8. The apparatus of any preceding clause, wherein the scan insertion signal is input to the scan register responsive to a first clock signal and the scan insertion signal is input to the non-scan register responsive to a second clock signal following the first clock signal.

Clause 9. The apparatus of any preceding clause, further comprising:

a register array comprising a plurality of lanes, wherein each respective lane comprises:

a respective non-scan register comprising a respective non-scan register signal input; and a respective multiplexer comprising a respective first multiplexer input, a respective second multiplexer input coupled to the scan register signal output, a respective multiplexer output coupled to the respective non-scan register signal input, and a respective selector;

wherein, responsive to a respective control signal transmitted via the respective selector, the respective multiplexer is to transmit the scan insertion signal from the scan register signal output to the respective non-scan register signal input via the respective second multiplexer input.

Clause 10. The apparatus of any preceding clause, wherein the scan register comprises a scan-enabled data flip-flop and the non-scan register comprises a non-scan-enabled data flip-flop.

Clause 11. A method, comprising:

transmitting a scan insertion signal to a scan register via a scan insertion signal input;

transmitting a control signal to a multiplexer via a selector, the multiplexer comprising the selector, a first multiplexer input, a second multiplexer input coupled to a scan register signal output of the scan register, and a multiplexer output coupled to a non-scan register signal input of a non-scan register; and responsive to the control signal, transmitting the scan insertion signal from the scan register signal output to the non-scan register signal input via the multiplexer.

Clause 12. The method of clause 11, further comprising:

responsive to the control signal, transmitting the scan insertion signal from the scan register signal output to a plurality of non-scan register signal inputs of a corresponding plurality of non-scan registers via the multiplexer.

Clause 13. The method of clauses 11-12, further comprising:

for each respective lane of a register array comprising a plurality of lanes:

transmitting a respective scan insertion signal to a respective scan register via a respective scan insertion signal input;

transmitting a respective control signal to a respective multiplexer via a respective selector, the respective multiplexer comprising the respective selector, a respective first multiplexer input, a respective second multiplexer input coupled to a respective scan register signal output of the respective scan register, and a respective multiplexer output coupled to a respective non-scan register signal input of a respective non-scan register; and responsive to the respective control signal, transmitting the respective scan insertion signal from the respective scan register signal output to the respective non-scan register signal input via the respective multiplexer.

Clause 14. The method of clauses 11-13, wherein the scan register and the plurality of non-scan registers comprise a register file, a buffer or a memory array, or a combination thereof.

Clause 15. The method of clauses 11-13, wherein the plurality of non-scan registers comprise a register file, a buffer or a memory array, or a combination thereof coupled to the scan register.

Clause 16. The method of clauses 11-15, wherein the scan register further comprises a non-scan signal input coupled to the multiplexer output, and further comprising:

responsive to the control signal, transmitting the scan insertion signal from the scan register signal output to the non-scan signal input via the multiplexer.

Clause 17. The method of clauses 11-16, further comprising:

inputting the scan insertion signal responsive to a first clock signal; and inputting the scan insertion signal to the non-scan register responsive to a second clock signal following the first clock signal.

Clause 18. A non-transitory computer-readable medium storing computer-readable code for fabrication of the apparatus of clauses 1-10.

Clause 19. The non-transitory computer-readable medium of clause 18, further comprising an indicator of the non-scan register being a shadow register of the scan register.

Clause 20. The non-transitory computer-readable medium of clauses 18-19, further comprising:

a first indicator to prevent the multiplexer from being removed during a circuit optimization procedure, a second indicator to prevent the non-scan register from being scanned during a testing procedure, and a third indicator to define the non-scan register as a shadow register of the scan register during the testing procedure.

What is claimed is:

1. An apparatus, comprising:

a scan register comprising a scan insertion signal input, a first non-scan register signal input, a control signal input, and a scan register signal output, wherein, responsive to a control signal via the control signal input, the scan register is to transmit a scan register signal from the scan register signal output as input via either the scan insertion signal input or the first non-scan register signal input;

a non-scan register comprising a second non-scan register signal input; and a multiplexer comprising a first multiplexer input, a second multiplexer input coupled to the scan register signal output of the scan register, a multiplexer output coupled to the first non-scan register signal input of the scan register and the second non-scan register signal input of the non-scan register, and a selector input; and wherein, responsive to a control signal transmitted via the selector input, the multiplexer is to either transmit a scan insertion signal from the scan register signal output as input via the first multiplexer input or transmit a non-scan signal as input via the second multiplexer input.

2. The apparatus of claim 1, further comprising:

a plurality of non-scan registers, each comprising a respective non-scan register signal input, wherein responsive to the control signal, the multiplexer is to transmit to each of the respective non-scan register signal inputs of the plurality of non-scan registers either the scan insertion signal via the first multiplexer input or the non-scan signal via the second multiplexer input.

3. The apparatus of claim 2, further comprising:

a register array comprising a plurality of lanes, wherein each respective lane comprises:

a respective scan register comprising a respective scan insertion signal input and a respective scan register signal output;

a respective non-scan register comprising a respective non-scan register signal input; and a respective multiplexer comprising a respective first multiplexer input, a respective second multiplexer input coupled to the respective scan register signal output, a respective multiplexer output coupled to the respective non-scan register signal input, and a respective selector input;

wherein, responsive to a respective control signal transmitted via the respective selector input, the respective multiplexer is either to transmit a respective scan insertion signal from the respective scan register signal output to the respective non-scan register signal input via the respective first multiplexer input or to transmit a respective non-scan signal via the respective second multiplexer input.

4. The apparatus of claim 3, wherein, for each respective lane:

the respective scan register further comprises a respective non-scan signal input coupled to the respective multiplexer output; and responsive to the respective control signal transmitted via the respective selector input, the respective multiplexer is to transmit the respective scan insertion signal from the respective scan register signal output to the respective non-scan signal input of the respective scan register via either the respective first multiplexer input or the respective second multiplexer input.

5. The apparatus of claim 2, wherein the scan register comprises a register file, a buffer or a memory array, or a combination thereof.

6. The apparatus of claim 2, wherein the plurality of non-scan registers comprise a register file, a buffer or a memory array, or a combination thereof coupled to the scan register.

7. The apparatus of claim 2, further comprising:

a register array comprising a plurality of lanes wherein each respective lane comprises:

a respective non-scan register comprising a respective non-scan register signal input; and a respective multiplexer comprising a respective first multiplexer input, a respective second multiplexer input coupled to the scan register signal output, a respective multiplexer output coupled to the respective non-scan register signal input, and a respective selector input;

wherein, responsive to a respective control signal transmitted via the respective selector input, the respective multiplexer is to transmit the scan insertion signal from the scan register signal output to the respective non-scan register signal input via either the respective first multiplexer input or the respective second multiplexer input.

8. The apparatus of claim 1, wherein the scan insertion signal is input to the scan register responsive to a first clock signal and the scan insertion signal is input to the non-scan register responsive to a second clock signal following the first clock signal.

9. The apparatus of claim 1, wherein the scan register comprises a scan-enabled data flip-flop and the non-scan register comprises a non-scan-enabled data flip-flop.

10. A method, comprising:

transmitting a scan insertion signal to a scan register via a scan insertion signal input;

transmitting a first control signal to the scan register via a control signal input;

responsive to the first control signal, transmitting a scan register signal from a scan register signal output of the scan register as input via either the scan insertion signal input or a first non-scan register signal input of the scan register;

transmitting a second control signal to a multiplexer via a selector input, the multiplexer comprising the selector input, a first multiplexer input, a second multiplexer input coupled to the scan register signal output of the scan register, and a multiplexer output coupled to the first non-scan register signal input of the scan register and a non-scan register signal input of a non-scan register; and responsive to the second control signal, transmitting either the scan insertion signal from the scan register signal output of the multiplexer as input via the first multiplexer input or a non-scan signal as input via the second multiplexer input.

11. The method of claim 10, further comprising:

for each respective lane of a register array comprising a plurality of lanes:

transmitting a respective scan insertion signal to a respective scan register via a respective scan insertion signal input;

transmitting a respective control signal to a respective multiplexer via a respective selector input, the respective multiplexer comprising the respective selector input, a respective first multiplexer input, a respective second multiplexer input coupled to a respective scan register signal output of the respective scan register, and a respective multiplexer output coupled to a respective non-scan register signal input of a respective non-scan register; and responsive to the respective control signal, transmitting the respective scan insertion signal from the respective scan register signal output to the respective non-scan register signal input via the respective multiplexer.

12. The method of claim 10, wherein the scan register comprises a register file, a buffer or a memory array, or a combination thereof.

13. The method of claim 10, wherein the non-scan register comprises a register file, a buffer or a memory array, or a combination thereof coupled to the scan register.

14. The method of claim 10, further comprising:

inputting the scan insertion signal responsive to a first clock signal; and inputting the scan insertion signal to the non-scan register responsive to a second clock signal following the first clock signal.

15. A non-transitory computer-readable medium storing computer-readable code for fabrication of an apparatus comprising:

a scan register comprising a scan insertion signal input, a first non-scan register signal input, a control signal input, and a scan register signal output, wherein, responsive to a control signal via the control signal input, the scan register is to transmit a scan register signal from the scan register signal output as input via either the scan insertion signal input or the first non-scan register signal input;

a non-scan register comprising a non-scan register signal input; and a multiplexer comprising a first multiplexer input, a second multiplexer input coupled to the scan register signal output of the scan register, a multiplexer output coupled to the first non-scan register signal input of the scan register and a second non-scan register signal input of the non-scan register, and a selector input;

wherein, responsive to a control signal transmitted via the selector input, the multiplexer is to either transmit a scan insertion signal from the scan register signal output as input via the first multiplexer input or transmit a non-scan signal as input via the second multiplexer input.

* * * * *